(12) United States Patent
Shi

(10) Patent No.: US 9,041,353 B2
(45) Date of Patent: May 26, 2015

(54) BATTERY FUEL GAUGE APPARATUS

(75) Inventor: Justin Shi, Ann Arbor, MI (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 695 days.

(21) Appl. No.: 13/212,588

(22) Filed: Aug. 18, 2011

(65) Prior Publication Data

US 2013/0045404 A1 Feb. 21, 2013

(51) Int. Cl.
*H02J 7/00* (2006.01)
*H01M 10/48* (2006.01)
*H01M 10/42* (2006.01)
*G01R 31/36* (2006.01)

(52) U.S. Cl.
CPC ........... *H01M 10/48* (2013.01); *G01R 31/3606* (2013.01); *H01M 10/425* (2013.01)

(58) Field of Classification Search
CPC .................................................... H01M 10/425
USPC .................... 320/132, 158, 163, 165, 149; 324/426–436
See application file for complete search history.

(56) References Cited

U.S. PATENT DOCUMENTS

| | | | | |
|---|---|---|---|---|
| 4,816,735 | A * | 3/1989 | Cook et al. ..................... | 320/110 |
| 5,889,386 | A * | 3/1999 | Koenck .......................... | 320/136 |
| 6,664,000 | B1 * | 12/2003 | Sonobe .......................... | 429/61 |
| 7,495,467 | B2 * | 2/2009 | Lin et al. ........................ | 326/30 |
| 2009/0146607 | A1 * | 6/2009 | Yang .............................. | 320/103 |
| 2009/0238239 | A1 * | 9/2009 | Pan ................................ | 374/178 |
| 2010/0134086 | A1 * | 6/2010 | Theil et al. .................... | 323/312 |

OTHER PUBLICATIONS

Texas Intruments bq27000, bq27010 Datasheet, "Single-Cell LI-Ion and LI-Pol Battery Gas Gauge IC for Portable Applications(bqJUNIOR™)," SLUS556—Feb. 2003, pp. 1-8.
Texas Instruments bq27010, bq27210 Datasheet, "Li-Ion and Li-Pol Battery Gas Gauge IC for Portable Applications (bqJUNIOR)," SLUS707B—Apr. 2006—Revised Jan. 2007, pp. 1-30.
Dallas Semiconductor Maxim DS2780 Datasheet, "Standalone Fuel Gauge IC," 19-4634;p May 2009, pp. 1-31.
Linear Technology LTC2941 Datasheet, "Battery Gas Gauge with $I^2$C Interface," 2941fa, 2010, pp. 1-16.
Linear Technology LTC2942 Datasheet, "Battery Gas Gauge with Temperature, Voltage Measurement," 2942fa, 2010, pp. 1-18.
Linear Technology LTC4150 Datasheet, "Coulomb Counter/Battery Gas Gauge," 4150fc, 2003, pp. 1-14.

* cited by examiner

*Primary Examiner* — Drew A Dunn
*Assistant Examiner* — Zixuan Zhou
(74) *Attorney, Agent, or Firm* — Slater & Matsil, L.L.P.

(57) ABSTRACT

A battery fuel gauge apparatus comprises a current amplifier formed by a first transistor and a second transistor. Both transistors operate in the same operation conditions except that the second transistor has a smaller channel width in comparison with that of the first transistor. The first transistor is connected in series with a battery pack. The second transistor is connected in series with a sensing device. The sensing device comprises a first resistor and a second resistor connected in series. The first resistor has a positive temperature coefficient and the second resistor has a negative temperature coefficient.

19 Claims, 6 Drawing Sheets

BATTERY FUEL GAUGE APPARATUS

BACKGROUND

A variety of battery powered portable devices, such as mobile phones, notebook computers and the like, have become popular. Each portable device may employ a plurality of rechargeable battery cells. The plurality of rechargeable battery cells may be connected in series or in parallel so as to form a rechargeable battery pack for storing electrical energy. Rechargeable batteries include a variety of types, such as nickel-cadmium (NiCd) batteries, nickel-metal hydride (NiMH) batteries, lithium-ion batteries, lithium-ion polymer batteries, lithium-air batteries, lithium iron phosphate batteries and the like.

Different types of rechargeable battery packs may employ different charging methods to charge from a depleted state to a full charged state using a power source such as an ac/dc adapter or a universal serial bus (USB) port. In order to have a reliable rechargeable battery pack and a long cycle life, the rechargeable battery pack should operate within a safe operation region to which the rechargeable battery pack is specified. Monitoring the remaining capacity of a rechargeable battery pack is an effective way to keep the rechargeable battery pack operating within the safe operation region. More particularly, an accurate estimate of the remaining capacity of the rechargeable battery pack is important to battery pack users to know the amount of energy left in the battery pack and how much more time the battery powered portable device can be used before the battery pack needs recharging. This is commonly referred to as a battery pack's State of Charge (SOC).

The capacity of a rechargeable battery pack can be calculated based upon the electrical charge flowing into the rechargeable battery pack and the electrical current flowing out of the rechargeable battery pack. The electrical charge may be monitored by a battery fuel gauge apparatus. In accordance with the operation principle of battery fuel gauges, battery fuel gauges may be further divided into three categories, namely a current integration based fuel gauge, a voltage measurement based fuel gauge and an internal impedance measurement based fuel gauge.

A current integration based fuel gauge is based upon an integral of charge and discharge currents of a rechargeable battery pack. More particularly, the battery fuel gauge apparatus detects the electrical charge by means of a sensing device such as a shunt resistor, a Hall Effect transducer, a giant magnetoresistance (GMR) sensor and the like. Furthermore, an analog-to-digital converter (ADC) may convert the analog signal detected by the battery fuel gauge into a digital signal and feed the digital signal to a microprocessor in which a variety of rechargeable battery fuel gauge algorithms may be employed to calculate the state of charge (SOC) of the rechargeable battery pack.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a battery fuel gauge apparatus. The invention may also be applied, however, to a variety of rechargeable battery packs.

Figure 1:
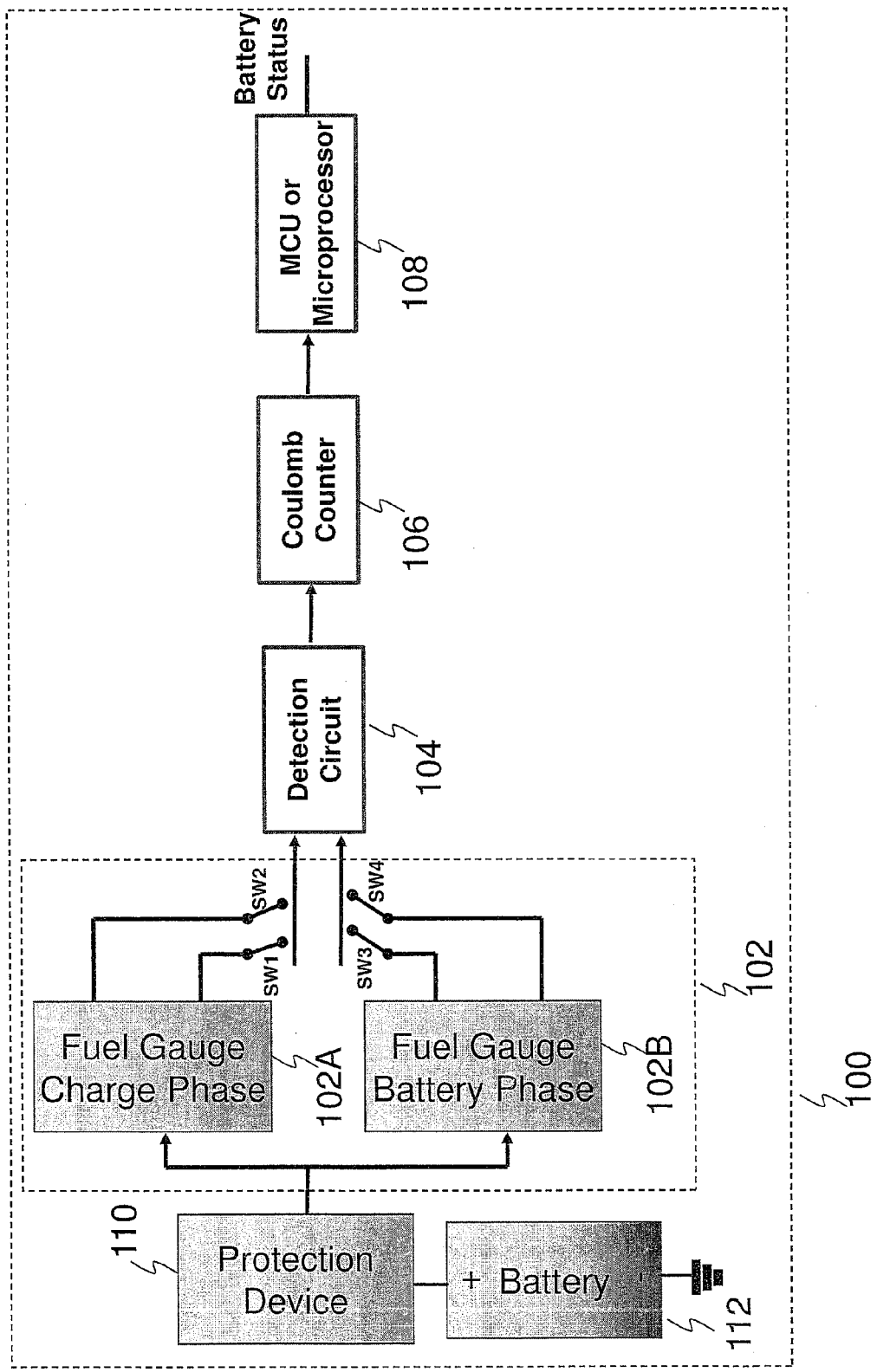
FIG. 1 illustrates a block diagram of a rechargeable battery fuel gauge system in accordance with an embodiment.

Referring initially to FIG. 1, a block diagram of a rechargeable battery fuel gauge system is illustrated in accordance with an embodiment. The rechargeable battery fuel gauge system 100 may comprise a rechargeable battery 112, a protection device 110 and a battery fuel gauge apparatus 102. The rechargeable battery 112 is coupled between an output terminal of the protection device 110 and ground. The rechargeable battery 112 may be a nickel-cadmium (NiCd) battery, a nickel-metal hydride (NiMH) battery, a lithium-ion battery, a lithium-ion polymer battery, a lithium-air battery, a lithium iron phosphate battery and the like. It should be noted while FIG. 1 shows the rechargeable battery 112 is a single cell, the rechargeable battery 112 may comprise a plurality of rechargeable battery cells connected either in series or in parallel.

The protection device 110 is placed between a terminal of the battery pack 112 and a battery charger (not shown). The protection device 110 may comprise a pair of back-to-back connected p-type metal oxide semiconductor (PMOS) transistors. When the pair of back-to-back connected PMOS transistors is turned off, the pair of back-to-back connected PMOS transistors can block conduction of current in either direction so as to isolate the battery pack 112 from external circuits (not shown). On the other hand, when the pair of back-to-back connected PMOS transistors is activated, the pair of back-to-back connected PMOS transistors can provide a conductive channel for charge and discharge currents. It should be noted that the current flowing through the protection device 110 is equal to that of the battery pack 112. As a result, the discharge and charge of the battery pack 112 can be measured by monitoring the current flowing through the protection device 110.

It should be noted that while the exemplary embodiment of the protection device 110 is a pair of back-to-back connected PMOS transistors, the present invention is applicable to protection devices formed by other system configurations such as a pair of back-to-back connected NMOS transistors and the like. It should further be noted that the present invention is also applicable to a variety of derivatives of the protection configuration described above. One of ordinary skill in the art would recognize many variations, alternatives, and modifications. For example, the scope of the present invention may extend to a protection device coupled between the negative terminal of the battery pack 112 and ground.

The battery fuel gauge apparatus 102 is coupled to the protection device 110. As shown in FIG. 1, the battery fuel gauge apparatus 102 further comprises a charge phase circuit 102A and a battery phase circuit 102B. Both the charge phase circuit 102A and the battery phase circuit 102B are coupled to a detection circuit 104 through a plurality of switches, namely SW1, SW2, SW3 and SW4. When the battery operates in a charge mode, switches SW1 and SW2 are turned on and switches SW3 and SW4 are turned off, as a result, the detected signal from the charge phase circuit 102A is sent to the detection circuit 104. On the other hand, when the battery operates in a battery mode, switches SW1 and SW2 are turned off and switches SW3 and SW4 are turned on, as a result, the detected signal from the battery phase circuit 102B is sent to the detection circuit 104.

In accordance with an embodiment, the fuel gauge apparatus 102 may replicate the current flowing through one PMOS transistor of the protection device 110 using a current mirror. The current minor (not shown) may comprise a transistor with a ratio of m to M in comparison with the PMOS transistor of the protection device 110. By scaling down the current flowing through the charger 110 by a ratio of M to m, the power consumption of the fuel gauge apparatus 102 is reduced accordingly. The detailed operation of the fuel gauge apparatus 102 will be described below with respect to FIG. 2 and FIG. 3.

The rechargeable battery fuel gauge system 100 may further comprise a detection circuit 104, a coulomb counter 106 and a microprocessor 108. The detection circuit 104, the coulomb counter 106 and the microprocessor 108 are connected in cascade to form a processing unit. The input terminal of the processing unit is coupled to the battery fuel gauge apparatus 102. Through the detection circuit 104, an analog signal generated by the battery fuel gauge apparatus 102 may be amplified to an appropriate level. Furthermore, the amplified analog signal may be converted into its corresponding digital signal.

A coulomb counter 106 is connected in series with the detection circuit 104. The coulomb counter 106 may be a highly accurate sigma-delta analog-to-digital converter (ADC), which is used to measure charge and discharge currents of the battery pack 112. As known in the art, the coulomb counter 106 is capable of providing two modes of operation. When the coulomb counter 106 operates in an instantaneous current conversion mode, the coulomb counter 106 can provide the value of the instantaneous current flowing through a battery as well as the voltage across the battery. In contrast, when the coulomb counter 106 operates in an accumulated current conversion mode, the coulomb counter 106 can provide an average value of the current flowing through the battery during a selected period. For example, the selected period can be 256, 512 or 1024 milliseconds.

The microprocessor 108 has an input coupled to the output of the coulomb counter 106. As known in the art, a variety of battery fuel gauge power management algorithms may be embedded in the microprocessor 108. By employing the fuel gauge power management algorithms, the microprocessor 108 may calculate the remaining capacity of the battery pack 112 so as to report the state of charge (SOC) of the battery pack 112. Furthermore, the microprocessor can take into consideration the environmental and device specific information of a battery to calculate the remaining capacity for each type of battery.

Figure 2:
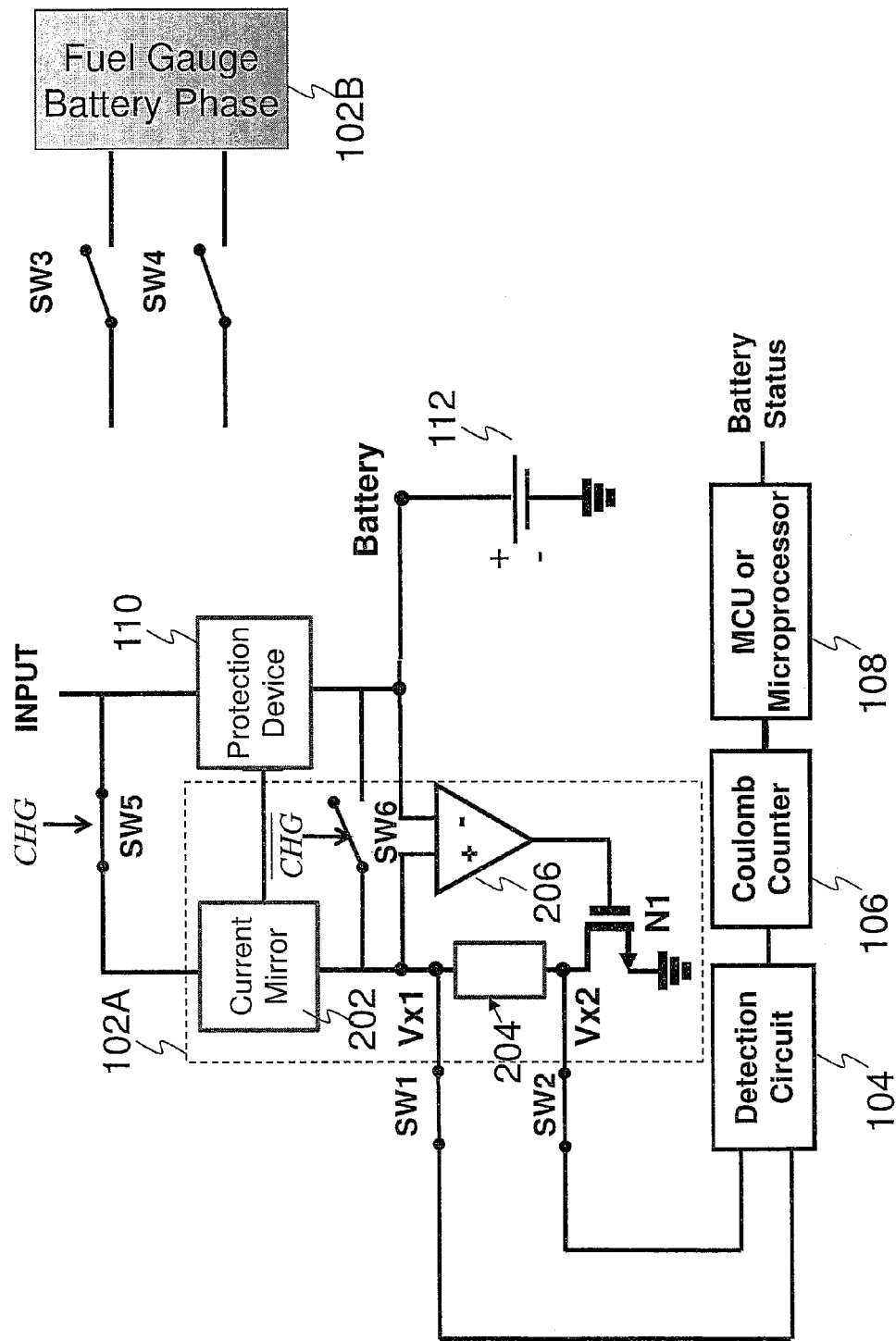
FIG. 2 illustrates a schematic diagram of the charge phase circuit 102A of the battery fuel gauge apparatus 102 shown in FIG. 1.

FIG. 2 illustrates a schematic diagram of the charge phase circuit 102A of the battery fuel gauge apparatus 102 shown in FIG. 1. The charge phase circuit 102A may comprise a current minor 202, a sensing device 204, an n-type metal oxide semiconductor (NMOS) transistor N1 and an operational amplifier 206. The current mirror 202 is coupled to the protection device 110. The current mirror 202 is used to scale down the current flowing through the protection device 110 to a lower level so that the power loss at the sensing device 204 can be reduced accordingly. The charge phase circuit 102A further comprises a first switch SW1 and a second switch SW2. As shown in FIG. 2, when the rechargeable battery 112 operates in a charge mode, both the first switch SW1 and the second switch SW2 are enabled. As shown in FIG. 2, the enabled switches SW1 and SW2 allow the detection circuit 104 to receive a signal detected across the sensing device 204. On the other hand, the battery phase circuit 102B is inactivated by turning off both a third switch SW3 and a fourth switch SW4. The detailed operation of the battery phase circuit will be discussed below with respect to FIG. 3.

The battery fuel gauge apparatus 102 further comprises a fifth switch SW5 and a sixth switch SW6. As shown in FIG. 2, the fifth switch SW5 is coupled between a first terminal of the current minor 202 and a first terminal of the protection device 110. Similarly, the sixth switch SW6 is coupled between a second terminal of the current minor 202 and a second terminal of the protection device 110. Control signals CHG and $\overline{CHG}$ are employed to control the operation of the fifth switch SW5 and the sixth switch SW6. More particularly, $\overline{CHG}$ is the inverse of CHG. As shown in FIG. 2, when the rechargeable battery 112 operates in a charge mode, CHG turns on the fifth switch SW5 and $\overline{CHG}$ turns off the sixth switch SW6. On the other hand, when the rechargeable battery 112 operates in a battery mode, the fifth switch SW5 will be turned off and the sixth switch SW6 will be turned on. The operation of the battery mode will be discussed in detail with respect to FIG. 3.

Referring to FIG. 2 again, in order to ensure an accurate scale-down from the protection device 110, the input of the current mirror 202 is coupled to the input of the protection device 110 through a turned-on switch SW5 and the output of the current mirror 202 is forced to be equal to the output of the protection device 110 by employing the operational amplifier 206. More particularly, when uneven voltages at two inputs of the operational amplifier 206 occur, the operational amplifier 206 may adjust the voltage across the NMOS transistor N1 by adjusting the voltage at the gate of the NMOS transistor N1. As a result, the voltage across the current minor 202 is forced to be equal to that of the protection device 110. The detailed operation principles of the battery fuel gauge apparatus 102 will be further described below with respect to FIG. 6.

Figure 3:
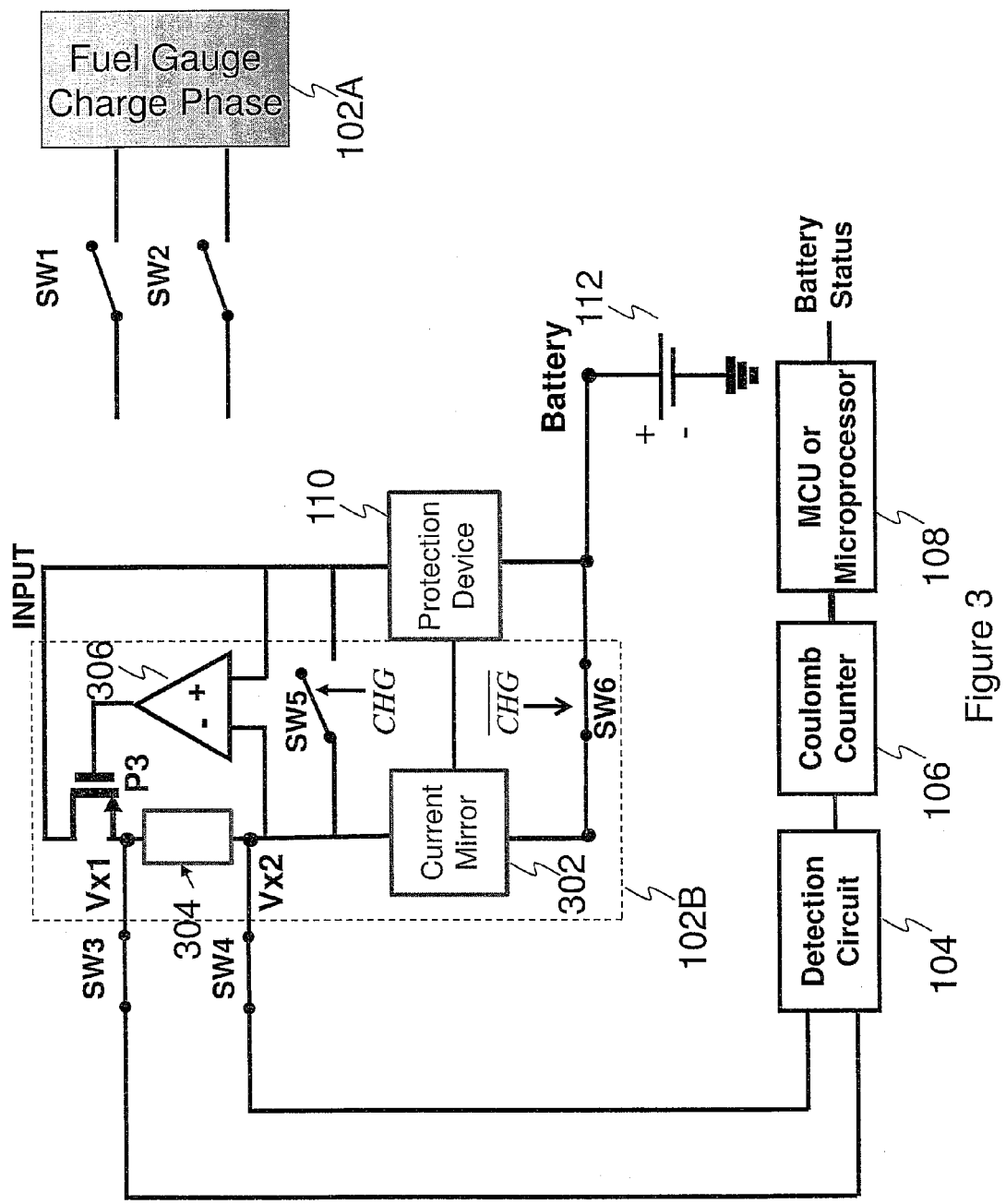
FIG. 3 illustrates a schematic diagram of the battery phase circuit 102B of the battery fuel gauge apparatus 102 shown in FIG. 1.

FIG. 3 illustrates a schematic diagram of the battery phase circuit 102B of the battery fuel gauge apparatus 102 shown in FIG. 1. A person of ordinary skill in the art will recognize that the configuration of the battery phase circuit 102B is similar to that of the charge phase circuit 102A except that the battery side of the current mirror 302 and the battery side of the protection device 110 are coupled together through a turned-on switch SW6. It should be noted that while FIG. 3 shows the current minor 302, the batter phase circuit 102B and the charge phase circuit 102A may share the same current minor (e.g., current mirror 202). Furthermore, the switch SW5 is turned off when the rechargeable battery 112 operates in a battery mode. The operation principles of the battery phase circuit 102B is similar to the operation principles of the charge phase circuit 102, and hence are not discussed in further detail. It should be noted that the first switch SW1 and the second switch SW2 are turned off when the rechargeable battery 112 operates in a battery mode. As a result, the charge phase circuit 102A is disabled during the battery mode. It should further be noted that the battery phase circuit 102B employs a different sensing device 304 in comparison with the charge phase circuit 102A shown in FIG. 2. Furthermore, the battery phase circuit 102B employs a p-type metal oxide semiconductor (PMOS) transistor P3 to achieve the same function of the NMOS transistor N1 shown in FIG. 2. It should also be noted that the PMOS transistor P3 acts to balance the two inputs of the operational amplifier 306 through the sensing device 304. In comparison with the system configuration of FIG. 2, the positive and negative inputs of the operational amplifier 306 are swapped to satisfy the loop feedback requirements of the PMOS transistor.

Figure 4:
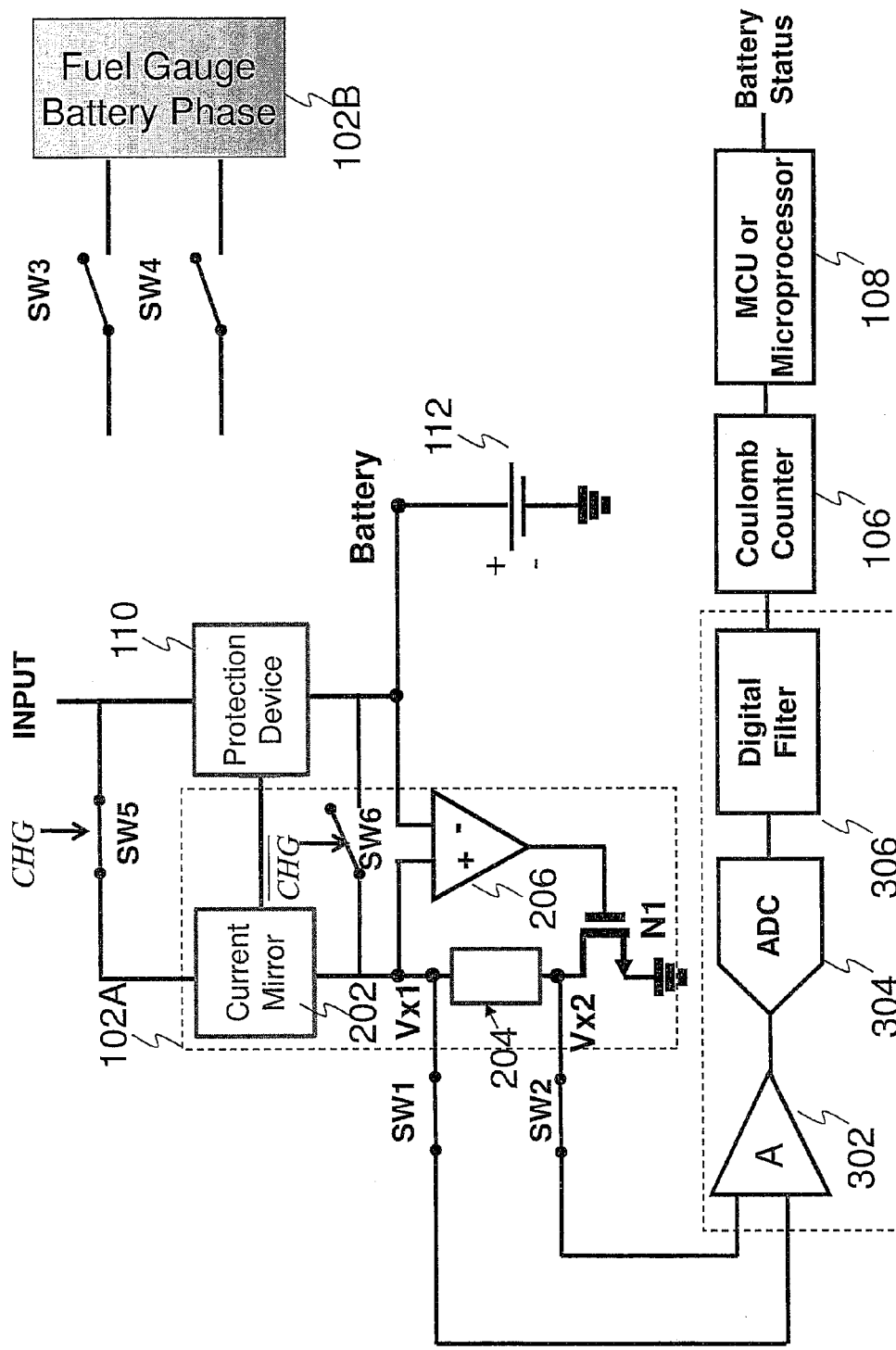
FIG. 4 illustrates a block diagram of the detection circuit 104 shown in FIG. 2.

FIG. 4 illustrates a block diagram of the detection circuit 104 shown in FIG. 2. In accordance with an embodiment, the detection circuit 104 may comprise a sense amplifier 302, an ADC 304 and a digital filter 306. As shown in FIG. 3, the sense amplifier 302, the ADC 304 and the digital filter 306 are connected in cascade. The sense amplifier 302 is used to amplify the signal across the sensing device 204 to a level appropriate for the ADC 304 to convert the analog signal to its corresponding digital signal. The digital filter 306 may be used to digitally manipulate the output signal from the ADC 304 (e.g., adding additional gain or altering the frequency components of the signal from the ADC 304). A down-sampler (not shown) may be included in the digital filter 306 to reduce the transmission rate and increase the data size of the signal chain while the Shannon-Nyquist sampling theorem criterion is still maintained. Additionally, the digital filter 306 provides an anti-aliasing filter in which unwanted noise may be eliminated and wanted signals may be amplified.

Figure 5:
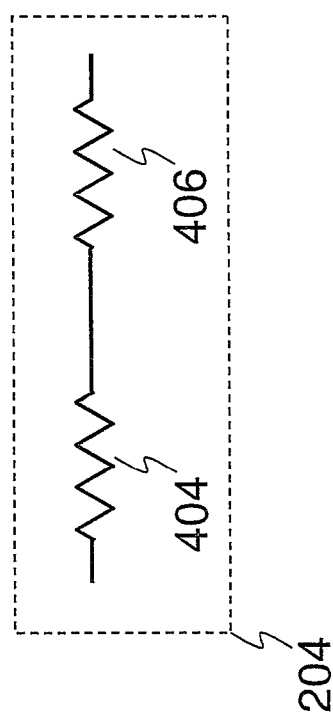
FIG. 5 illustrates a schematic diagram of the sensing device 204 in accordance with an embodiment.

FIG. 5 illustrates a schematic diagram of the sensing device 204 in accordance with an embodiment. The sensing device 204 may comprise a first sensing resistor 404 and a second sensing resistor 406 connected in series. The first sensing resistor 404 may be a silicided poly resistor. The second sensing resistor 406 may be a non-silicided poly resistor. In accordance with the characteristics of both resistors, the first sensing resistor 404 formed by silicided poly has a positive temperature coefficient. In contrast, the second sensing resistor 406 formed by non-silicided poly has a negative temperature coefficient. By connecting the first sensing resistor 404 and the second sensing resistor 406 in series, the resistance of the sensing device 204 may remain approximately constant under temperature variations. One skilled in the art will understand the temperature variation compensation scheme based upon the characteristics of silicided poly resistors and non-silicided poly resistors. Therefore, the formation of the sensing device 204 is not discussed in further detail herein. It should be recognized that while FIG. 5 illustrates the sensing device 204 with two resistors connected in series, the sensing device 204 could accommodate any number of resistors connected in series, in parallel or any combinations thereof.

Figure 6:
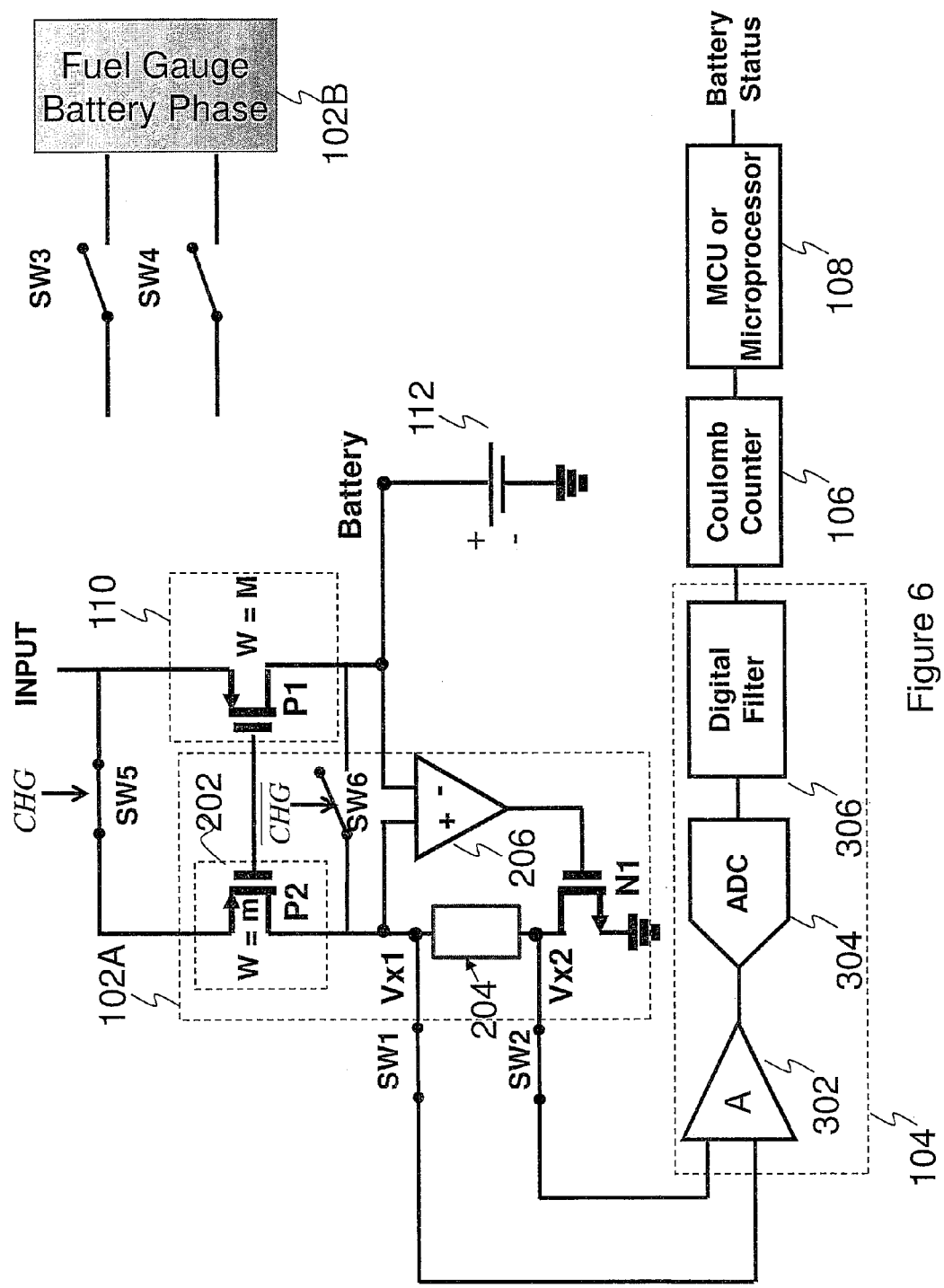
FIG. 6 illustrates in detail a schematic diagram of the current mirror 202 and the protection device 110 shown in FIG. 2.

FIG. 6 illustrates in detail a schematic diagram of the current mirror 202 and the protection device 110 shown in FIG. 2. In accordance with an embodiment, the protection device 110 may be a PMOS transistor P1 having a channel width equal to M. It should be noted while FIG. 6 illustrates a single PMOS transistor P1, the protection device 110 may comprise a pair of PMOS transistors back-to-back connected in series. Either PMOS transistor of the back-to-back connected PMOS transistors can be used to form a current amplifier with the current minor 202. In accordance with an embodiment, the channel width of the PMOS transistor P1 is large to support a smaller on-resistance of the protection device 110.

In order to reduce power consumption, a PMOS transistor P2 having a channel width equal to m is paired with the PMOS transistor P1 to form a current minor. The gates of the PMOS transistors P1 and P2 are connected each other. The sources of the PMOS transistors P1 and P2 are connected to the same voltage potential INPUT. The drains of the PMOS transistors P1 and P2 are connected to the negative and positive inputs of the operational amplifier 206 respectively. As a result, the operational amplifier 206 can force the voltage at the drain of the PMOS transistor P1 equal to that of the PMOS transistor P2. Because the drains, sources and gates of two PMOS transistors P1 and P2 are of the same voltage potentials, the current flowing through each PMOS transistor is proportional to its channel width. As a result, the transfer ratio of the current mirror formed by the PMOS transistors P1 and P2 is M to m. It should be noted that m is much smaller than M. As such, the current flowing through the PMOS transistor P2 is much less than that flowing through the PMOS transistor P1.

An advantageous feature of having a current mirror with a ratio of M to m is that the power consumption at the sensing device 204 is reduced by a factor of M/m. The total efficiency of the fuel gauge apparatus can be improved as a result. Another advantageous feature of having the current mirror 202 is that the PMOS transistor P1 is usually already in a battery system. By employing the current minor 202, the current flowing through the PMOS transistor P1 can be detected without the need of an external resistor. As such, such a battery fuel gauge mechanism can save on component and packaging costs.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
    a first transistor coupled to a battery pack;
    a second transistor comprising:
        a second gate coupled to a first gate of the first transistor; and
        a second output terminal coupled to a first output terminal of the first transistor;
    a sensing device coupled to the second transistor;
    a third transistor coupled to the sensing device; and
    an operational amplifier comprising:
        a first input coupled to the first transistor;
        a second input coupled to the second transistor; and
        an output coupled to the third transistor.

2. The apparatus of claim 1, wherein the third transistor is an n-type metal oxide semiconductor transistor comprising:
a drain coupled to the sensing device;
a source coupled to ground; and
a gate coupled to the output of the operational amplifier.

3. The apparatus of claim 1, wherein the third transistor is a p-type metal oxide semiconductor transistor comprising:
a source coupled to the sensing device;
a drain coupled to the first transistor; and
a gate coupled to the output of the operational amplifier.

4. The apparatus of claim 1, wherein the sensing device comprises a combination of a first resistor and a second resistor.

5. The apparatus of claim 4, wherein the first resistor has a positive temperature coefficient and the second resistor has a negative temperature coefficient.

6. The apparatus of claim 1, wherein the first transistor with a first channel width and the second transistor with a second channel width form a current minor with a current ratio equal to a ratio between the first channel width and the second channel width.

7. The apparatus of claim 1, further comprising:
a first switch between a drain of the first transistor and a drain of the second transistor; and
a second switch between a source of the first transistor and a source of the second transistor.

8. A system comprising:
a battery pack coupled to a protection device comprising a first transistor;
a battery fuel gauge apparatus comprising:
    a second transistor comprising:
        a second gate coupled to a first gate of the first transistor; and
        a second output terminal coupled to a first output terminal of the first transistor;
    a sensing device coupled to the second transistor;
    a third transistor coupled to the sensing device; and
    an operational amplifier comprising:
        a first input coupled to the first transistor;
        a second input coupled to the second transistor; and
        an output coupled to the third transistor;
a detection circuit coupled to the sensing device; and
a processing circuit coupled to the detection circuit.

9. The system of claim 8, wherein the detection circuit comprises:
a sense amplifier having two inputs coupled to the sensing device;
an analog-to-digital converter coupled to an output of the sense amplifier; and
a digital filter coupled to an output of the analog-to-digital converter.

10. The system of claim 8, wherein the processing circuit comprises:
a coulomb counter having an input coupled to the detection circuit; and
a microprocessor having an input coupled to the coulomb counter.

11. The system of claim 10, wherein the microprocessor is configured to calculate and report a capacity level of the battery pack.

12. The system of claim 8, wherein the battery pack comprises a plurality of battery cells.

13. The system of claim 8, further comprising a plurality of switches coupled between the sensing device and the detection circuit.

14. The system of claim 8, wherein the first transistor and the second transistor form a current minor configured such that:
a current flowing into the second transistor is reduced by a factor of M/m in comparison with a current flowing into the first transistor.

15. A method comprising:
coupling a first transistor to a battery pack;
configuring a second transistor such that:
    the second transistor has a same operating condition as that of the first transistor;
coupling a sensing device to the second transistor; and
coupling a third transistor to the sensing device;
coupling an output of an operational amplifier to a gate of the third transistor; and
adjusting the gate of the third transistor when a voltage across the second transistor is not equal to a voltage across the first transistor.

16. The method of claim 15, further comprising:
amplifying an analog signal across the sensing device;
converting the analog signal into a digital signal; and
filtering off unwanted noise.

17. The method of claim 15, further comprising:
providing an instantaneous value of a current flowing through the first transistor; and
providing an average value of the current flowing through the first transistor.

18. The method of claim 15, further comprising:
calculating a capacity level of the battery pack; and
reporting the capacity level of the battery pack.

19. The method of claim 15, further comprising:
forming the sensing device by a combination of a first resistor with a second resistor, wherein the first resistor has a positive temperature coefficient and the second resistor has a negative temperature coefficient.

* * * * *